United States Patent
Goktepeli et al.

(10) Patent No.: US 7,534,674 B2
(45) Date of Patent: May 19, 2009

(54) METHOD OF MAKING A SEMICONDUCTOR DEVICE WITH A STRESSOR

(75) Inventors: Sinan Goktepeli, Austin, TX (US);
Venkat R. Kolagunta, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 181 days.

(21) Appl. No.: 11/737,492

(22) Filed: Apr. 19, 2007

(65) Prior Publication Data

US 2008/0261355 A1    Oct. 23, 2008

(51) Int. Cl.
*H01L 21/336* (2006.01)
*H01L 21/8234* (2006.01)
*H01L 21/8238* (2006.01)

(52) U.S. Cl. .............. 438/197; 438/154; 438/206; 438/209; 438/230; 438/276; 257/E21.633; 257/E21.64; 257/E21.632

(58) Field of Classification Search .......... 257/E21.633, 257/E21.64, E21.632
See application file for complete search history.

(56) References Cited

U.S. PATENT DOCUMENTS

| | | | |
|---|---|---|---|
| 6,573,172 B1 * | 6/2003 | En et al. .................. | 438/626 |
| 6,621,131 B2 | 9/2003 | Murthy et al. | |
| 2007/0141775 A1 * | 6/2007 | Teo et al. ................ | 438/231 |
| 2007/0202653 A1 * | 8/2007 | Hoentschel et al. ..... | 438/301 |

OTHER PUBLICATIONS

Boeuf et al; "A Conventional 45nm CMOS node Low-Cost Platform for General Purpose and Low Power Applications"; Electron Devices Meeting, 2004. IEDM Technical Digest. IEEE International Dec. 13-15, 2004 pp. 425-428.

* cited by examiner

*Primary Examiner*—Walter L Lindsay, Jr.
*Assistant Examiner*—Mohsen Ahmadi
(74) *Attorney, Agent, or Firm*—James L. Clingan, Jr.; Robert L. King

(57) ABSTRACT

First and second transistors are formed adjacent to each other. Both transistors have gate sidewall spacers removed. A stressor layer is formed overlying the first and second transistors. Stress in the stressor layer that overlies the first transistor is modified. Stress in the stressor layer that overlies the second transistor is permanently transferred to a channel of the second transistor. The stressor layer is removed except adjacent the gate electrode sidewalls of the first transistor and the second transistor where the stressor layer is used as gate sidewall spacers. Electrical contact to electrodes of the first transistor and the second transistor is made while using the gate sidewall spacers for determining a physical boundary of current electrodes of the first and second transistors. Subsequently formed first and a second stressors are positioned close to transistor channels of the first and second transistors.

19 Claims, 5 Drawing Sheets

METHOD OF MAKING A SEMICONDUCTOR DEVICE WITH A STRESSOR

CROSS-REFERENCE TO RELATED APPLICATION(S)

This application is related to U.S. patent application Ser. No. 11/737,496, filed on even date, titled "Method of Making a Semiconductor Using a Stressor," naming Da Zhang, Xiang Bo, and Venkat Kolagunta as inventors, and assigned to the current assignee hereof.

BACKGROUND

1. Field

This disclosure relates generally to semiconductors, and more specifically, to semiconductor devices with stressors.

2. Related Art

In the development integrated circuits, one of the improvements in performance has been the use of altering the strain in the channel of MOS transistors to increase carrier mobility. Electron mobility has been found to improve by providing tensile stress in the channel of N channel transistors, and hole mobility has been found to improve by providing compressive stress in the channel of P channel transistors. The mobility improvement is generally proportional to the stress in the channel. As long as the monocrystalline structure is maintained in the channel, more stress is better. Thus, there is generally an improvement if an increase in stress is provided for a given transistor. Improvement in overall integrated circuit performance can be achieved by improving the performance of either the P or N channel transistors while not degrading the other. This type of improvement can be sufficient for many applications and is likely to add less process complexity than attempting to provide both compressive stress for the P channel transistors and tensile stress for the N channel transistors.

Thus there is a need for achieving one or more of the above objectives while increasing stress.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device has a P channel device and an N channel device. After an implantation for forming the source/drain regions, sidewall spacers are removed from the gates. A liner is left around the gates. A stressor layer is deposited over the gates. Since there is only the liner between the gates and the stressor layer, there is a high degree of coupling of the stress of the stressor layer to the channels. One of the transistor types is masked and the stressor layer is implanted so that portion of the stressor layer over the non-masked transistor type receives the implant. The implant causes the stressor layer, where it receives the implant, to relax. The transistor that was masked thus still has its channel stressed by the stressor layer because that portion of the stressor layer did not receive the implant. This stress of the stressor layer is transferred to the channel of the previously masked transistor by a subsequent anneal. Following the anneal, the stressor layer can be removed while leaving stress in the channel. Rather than completely removing the stressor layer, an anisotropic etch is performed to leave sidewall spacers on the gates. These sidewall spacers are useful in spacing the channel from the subsequent silicide formation. Because of the anneal, the stress is retained in the channel of the previously masked transistor even though the stressor layer is substantially removed. This is better understood by reference to the following description and the drawings.

The semiconductor substrate described herein can be any semiconductor material or combinations of materials, such as gallium arsenide, silicon germanium, semiconductor-on-insulator (SOI) or bulk, silicon, monocrystalline silicon, the like, and combinations of the above.

Figure 1:
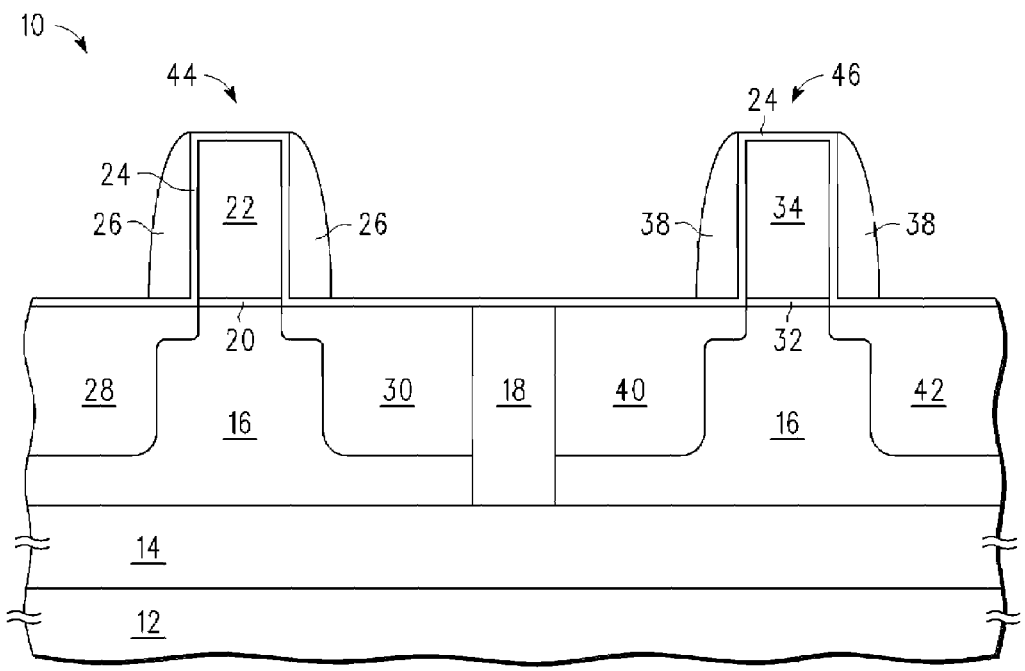
FIG. 1 is a cross section of a semiconductor device at a stage in processing according to one embodiment.

Shown in FIG. 1 is a semiconductor device comprising a transistor region 44, a transistor region 46, and an isolation region 18 separating transistor regions 44 and 46. Transistors regions 44 and 46 use a semiconductor supporting substrate 12, an insulating layer 14 on substrate 12, and a semiconductor layer 16 on insulating layer 14. Transistor region 44 has a gate dielectric 20 over semiconductor layer 16, a gate electrode 22 over gate dielectric 20, a source/drain 28 in semiconductor layer 16 and substantially aligned to one side of gate 22, a source/drain 30 in semiconductor layer 16 and substantially aligned to an opposite side of gate 22, a liner 24 around and over gate electrode 22 and over source/drains 28 and 30 and extending to transistor region 46, and a sidewall spacer 26 on liner 24 and surrounding gate 22. Isolation region 18 extends through semiconductor layer 16 to insulating layer 14. Similarly, transistor region 46 has a gate dielectric 32 over semiconductor layer 16, a gate electrode 34 over gate dielectric 32, a source/drain 40 in semiconductor layer 16 and substantially aligned to one side of gate 34, a source/drain 42 in semiconductor layer 16 and substantially aligned to an opposite side of gate 34, the liner 24 around and over gate electrode 34 and over source/drains 40 and 42, and a sidewall spacer 38 on liner 24 and surrounding gate 34. Transistor regions 44 and 46 may be formed by conventional processes. In this example, semiconductor supporting substrate 12 comprises silicon, insulating layer 14 comprises oxide, semiconductor layer 16 comprises silicon, isolation region 18 comprises oxide, transistor region 44 is for an N channel transistor, transistor region 46 is for a P channel transistor, liner 24 comprises oxide, spacers 26 and 38 comprise nitride, and gate electrodes 22 and 34 comprise polysilicon. These materials may vary. For example, gate electrodes 22 and 34 may comprise a combination of layers in which one or more of the layers may be metal. Also, source/drain regions 28, 30, 40, and 42 may comprise a combination of semiconductor materials such as silicon plus carbon or silicon plus germanium. The thickness of gate electrodes 22 and 34 in this example is about 1000 Angstroms but could vary significantly from that.

Figure 2:
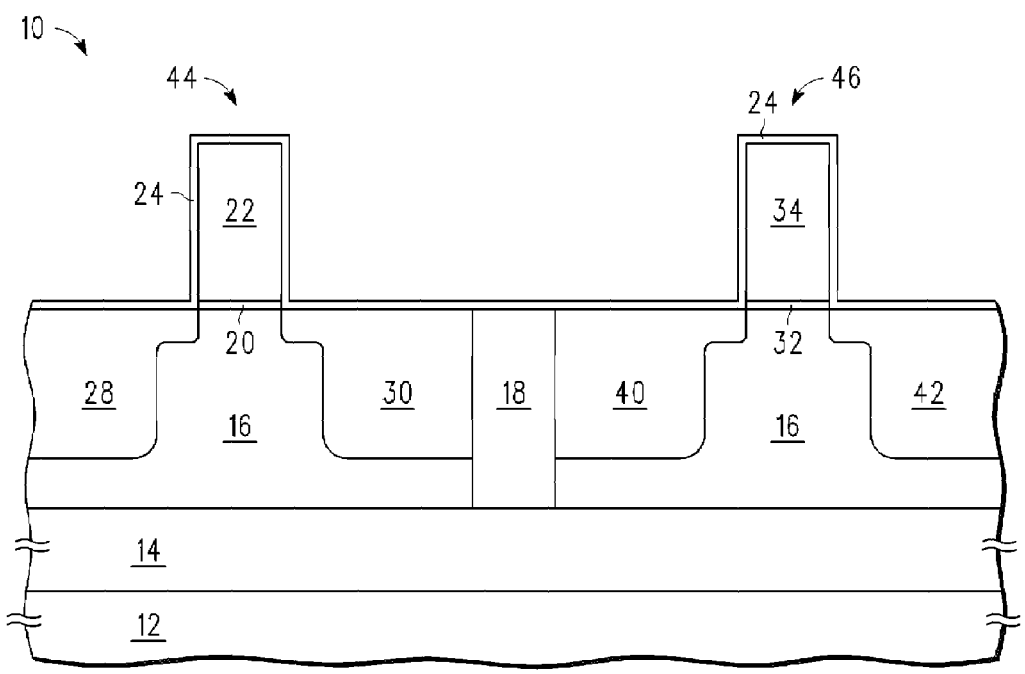
FIG. 2 is a cross section of the semiconductor device of FIG. 1 at a subsequent stage in processing.

Shown in FIG. 2 is semiconductor device 10 after removing sidewall spacers 26 and 38. There are well known etchants for removing nitride selective to oxide. Liner 24 is thus left after removing sidewall spacers 26 and 28. Alternatively, liner 24 could be removed prior to implants to define the source/drain regions 28, 30, 40 and 42. Following the implants to define the source/drain regions 28, 30, 40 and 42, a liner could be re-deposited resulting in significantly similar structure as that shown in FIG. 2 in which the re-deposited liner would be equivalent to liner 24 shown in FIG. 2. In such a case of a re-deposited liner, another alternative is for the re-deposited liner to have a stress value different from that of liner 24.

Figure 3:
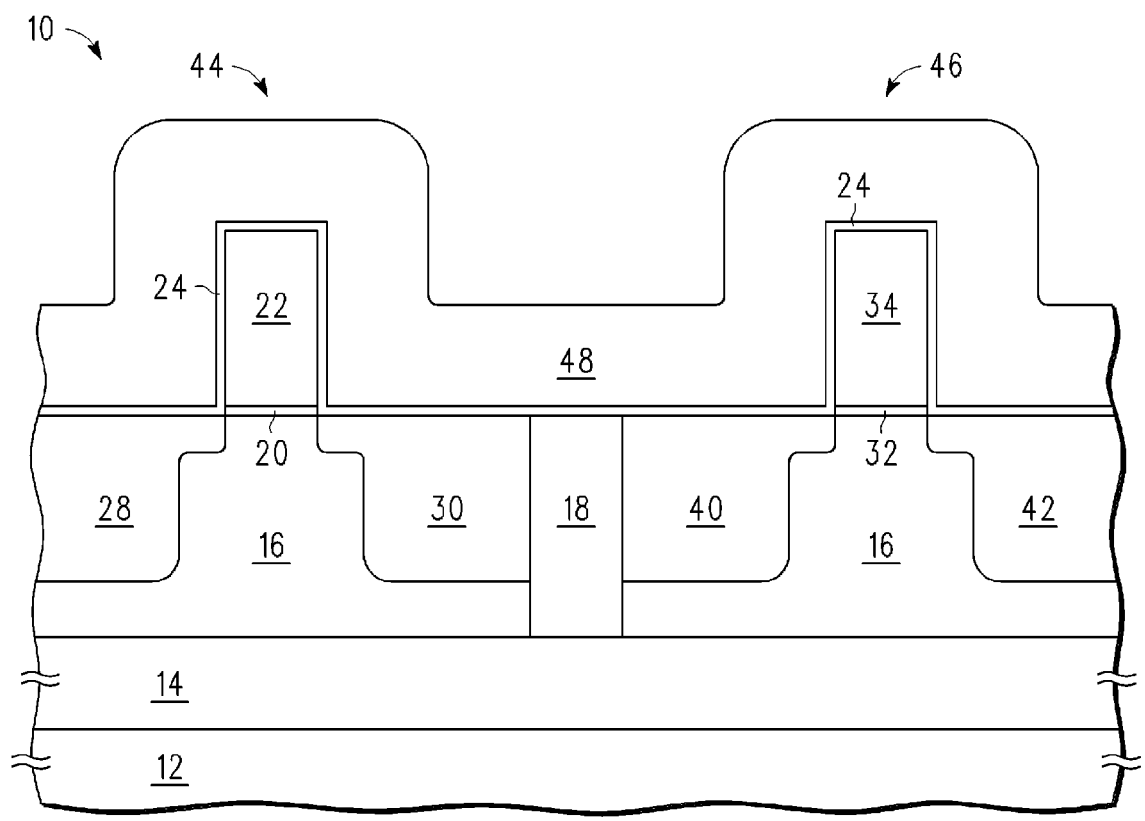
FIG. 3 is a cross section of the semiconductor device of FIG. 2 at a subsequent stage in processing.

Shown in FIG. 3 is semiconductor device 10 after depositing a stressor layer 48 over liner 24 and thus over gate electrodes 22 and 34 and source/drains 28, 30, 40, and 42. Stressor layer 48, in this example, is nitride deposited with tensile stress. With only liner 24 on the sides of gate electrodes 22 and 34 there is excellent coupling between stressor layer 48 and transistor channels which are the regions in semiconductor layer 16 immediately under gate electrodes 22 and 34 and between the respective source/drain regions. Stressor layer 48 is about 300-800 Angstroms but could vary significantly from that.

Figure 4:
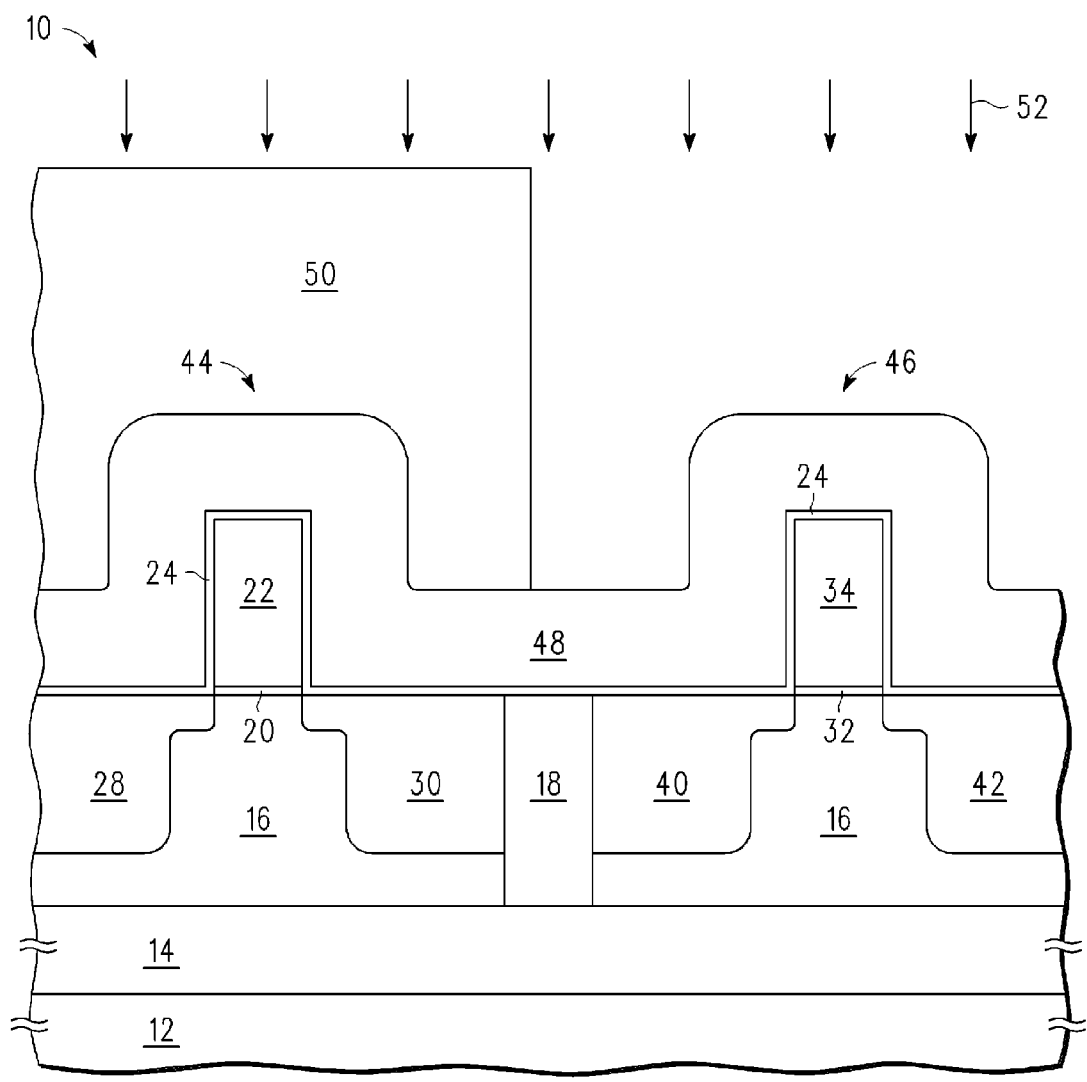
FIG. 4 is a cross section of the semiconductor device of FIG. 3 at a subsequent stage in processing.

Shown in FIG. 4 is semiconductor device 10 after forming a masking layer over transistor region 44 while leaving transistor region 46 exposed. Also shown is an implant 52 that impacts stressor layer 48 in transistor region 46. This shows that a portion of stressor layer, the portion in transistor region 46, has become a relaxed layer 54. The implant species for implant 52 is preferably xenon. Other implant species such as germanium, oxygen, fluorine, and carbon may used as an alternative for xenon. An effective dose of xenon for an 800 Angstrom nitride layer is 1e14 (10 to the $14^{th}$) per centimeter squared at an energy of 70 KeV. Other doses and energies may also be effective. The dose and energy needs to be adjusted based on the thickness and material properties of stressor layer 48.

Figure 5:
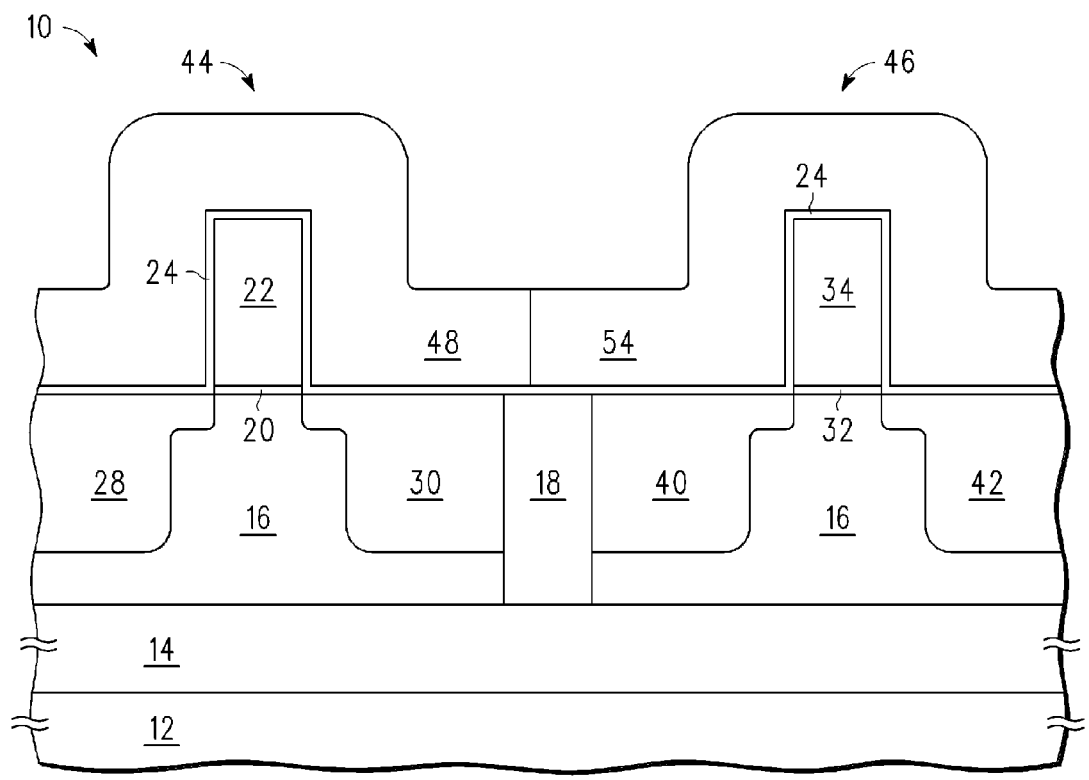
FIG. 5 is a cross section of the semiconductor device of FIG. 4 at a subsequent stage in processing.

FIG. 5 shows a relaxed layer 54 that is the portion of layer 48 that received implant 52. Implant 52 converted the portion of stressor layer 48 that is over region 46, the region for the P channel transistor, from tensile to relaxed resulting in relaxed layer 54. Thus there is still the desired tensile stress in stressor layer 48 over region 44, the region of the N channel transistor. The tensile stress of stressor layer 48 of FIG. 5 causes the channel of the N channel transistor to be under stress. On the other hand, relaxed layer 54 is not causing the channel of the P channel transistor to be under stress because it is relaxed. An anneal is then performed to permanently transfer the tensile stress of stressor layer 48 of FIG. 5 to the channel of the N channel transistor of transistor region 44. The anneal causes the stress on the channel of the N channel transistor to remain even if stressor layer 48 of FIG. 5 is removed. Thus, the stress in the channel can be considered permanent or retained in the sense that stress in the channel is retained upon removal of stressor layer 48 and thus no longer reliant on the presence of stressor layer 48 for being present, but the stress in the channel can be enhanced by subsequently applied tensile stress. Because relaxed layer 54 is not tensile, it is not imparting undesirable tensile stress to the channel of the P transistor and the anneal does not alter that. An effective anneal to achieve this retained stress is a rapid thermal anneal (RTA) with a peak of 1000-1100 degrees Celsius. Other types of anneals and temperatures may also be effective. A laser anneal may be preferred for example.

Figure 6:
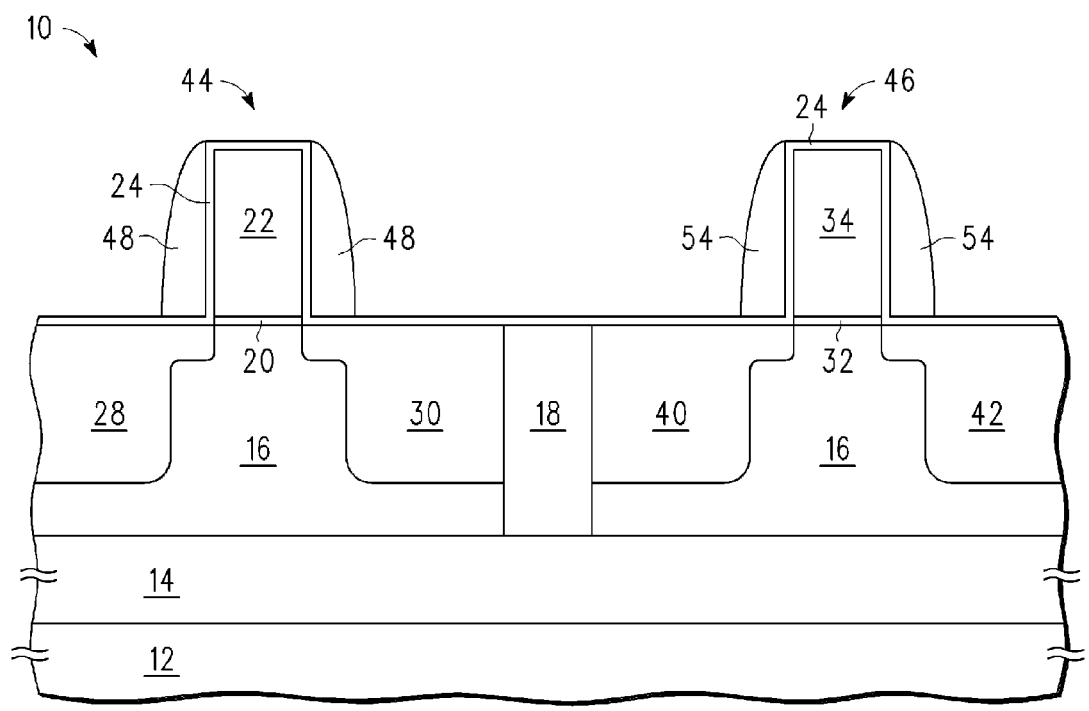
FIG. 6 is a cross section of the semiconductor device of FIG. 5 at a subsequent stage in processing.

Shown in FIG. 6 is semiconductor device 10 after performing an anisotropic etch to remove a majority of layers 48 and 50 but leave a portion of stressor layer 48 as a sidewall spacer around gate electrode 22 and leave a portion of relaxed layer 54 as a sidewall spacer around gate electrode 34. Techniques for performing anisotropic etches of nitride to form sidewall spacers are well known. Due to the anneal described for FIG. 5, the substantial removal of layer 48 does not cause the desirable tensile stress applied to the channel of the N channel transistor to be removed.

Figure 7:
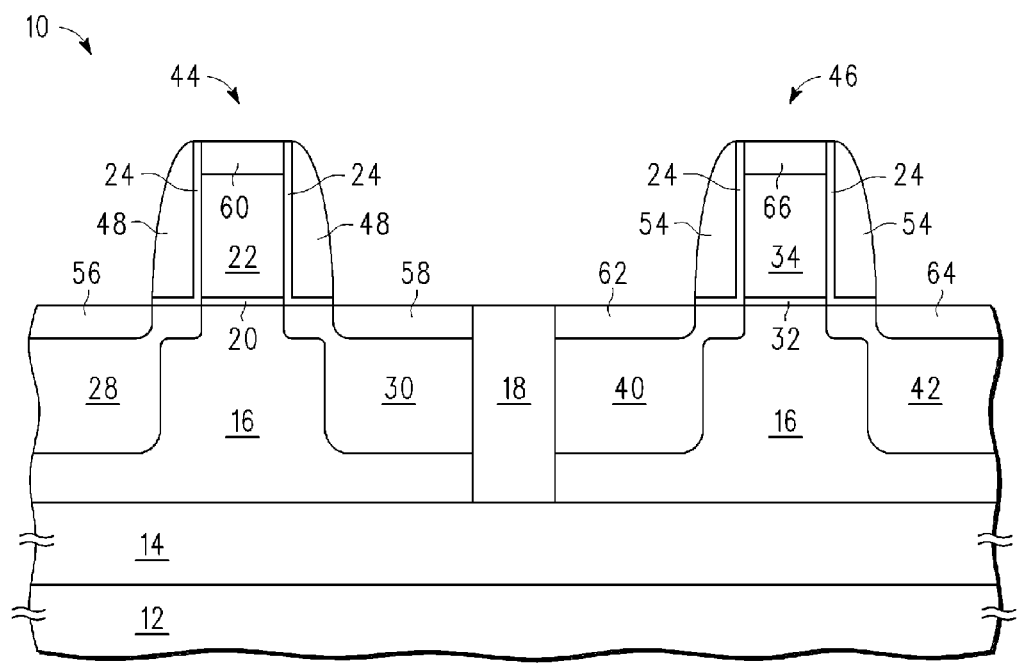
FIG. 7 is a cross section of the semiconductor device of FIG. 6 at a subsequent stage in processing.

Shown in FIG. 7 is semiconductor device 10 after forming silicide regions 56, 58, 62, and 64 in the top portions of source/drains 28, 30, 40, and 42, respectively, and silicide regions 60 and 66 in the top portions of gate electrodes 22 and 34, respectively. Sidewall spacers formed from stressor layers 48 and 54 are useful in defining boundaries of the silicide regions. In particular, the silicide regions 56 and 58 are ensured of staying within source/drain regions 28 and 30, respectively and silicide regions 62 and 64 are ensured of staying within source/drain regions 40 and 42, respectively. This consideration is somewhat different from the considerations for sidewall spacers 26 and 38 of FIG. 1. Sidewall spacers 26 and 38 would typically be a mask for the implant that forms the deep portion of source/drain regions 28, 30, 40, and 42. Sidewall spacers 26 and 38 may also be used as masks to modify the semiconductor composition of the source/drain regions 28, 30, 40 and 42 in a process, for example, which forms a recess in the sourced/drain regions and then fills the recess with epitaxial growth. Since the sidewall spacers 26 and 38 for the deep source/drain implant are different from the sidewall spacers 48 and 54 used for silicide formation, each of the sidewall spacers can be separately optimized for their particular function.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, it may be desirable to have different mobilities for two transistors of the same type so that transistor regions 44 and 46 may both be for P channel transistors or both be for N channel transistors. Another alternative would be to deposit the stressor layer as compressive and modify it over the N channel to the relaxed state or even the tensile state by an appropriate modification technique and leave it compressive over the P channel region. Another alternative is deposit the stressor layer in a relaxed state and modify a portion of it to become compressive or tensile or even modify one portion to tensile and the other to compressive. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

A method includes providing a substrate, forming a P-channel transistor and an N-channel transistor using the substrate, removing the first sidewall spacer of the P-channel transistor and the N-channel transistor, forming a stressor layer having a stress characteristic and overlying the P-channel transistor and the N-channel transistor, modifying the stress characteristic of the stressor layer, transferring the stress characteristic, and forming a second sidewall spacer. The forming the P-channel transistor and N-channel transistors is characterized by the P-channel transistor and the N-channel transistor comprising a source, a drain and a gate having a first sidewall spacer. The modifying the stress characteristic is characterized by overlying the P-channel transistor to form a modified stress characteristic differing from a portion overlying the N-channel transistor. The transferring the stress characteristic is of an overlying portion of the stressor layer to a channel of each of the N-channel transistor and the P-channel transistor by annealing. The second sidewall spacer is formed adjacent the gate of each of the P-channel transistor and the N-channel transistor and is formed from the stressor layer. The forming the second sidewall spacer adjacent each of the P-channel transistor and the N-channel transistor may remove portions of the stressor layer wherein remainder portions of the stressor layer comprise the second sidewall spacer adjacent the gate of each of the P-channel transistor and the N-channel transistor. There may be provided an etch stop layer overlying the source and the drain of each of the P-channel transistor and the N-channel transistor when removing the stressor layer. There may be formed silicided electrical contacts to each of the source, the drain and the gate of the P-channel transistor and the N-channel transistor while using the second sidewall spacer adjacent the gate of each of the P-channel transistor and the N-channel transistor for determining a physical boundary of the silicided electrical contacts to the source and drain of the P-channel transistor and N-channel transistor. The modifying the stress characteristic from the stressor layer overlying the P-channel transistor may further comprise implanting the stressor layer. There may further be ion implanting the stressor layer overlying only the P-channel transistor with either xenon or germanium ions. The substrate may be a semiconductor substrate. There may be provided the substrate overlying an insulator to form a silicon-on-insulator (SOI) semiconductor device. The stress characteristic may be tensile. The forming the stressor layer further may further be characterized as forming a nitride film. Forming the first sidewall spacer to have a different size than the second sidewall spacer.

Also a method includes forming a first transistor adjacent a second transistor, removing sidewall spacers from around gate electrodes of the first transistor and the second transistor, forming a stressor layer overlying the first transistor and the second transistor, relaxing stress, transferring stress, removing the stressor layer except adjacent gate electrode sidewalls of the first transistor and the second transistor, and forming silicide contact. The relaxing stress relaxes stress in the stressor layer that overlies the first transistor while not substantially modifying stress in the stressor layer that overlies the second transistor. The transferring stress is of the stressor layer to a channel of each of the first transistor and the second transistor by annealing. The forming silicide contact is to electrodes of the first transistor and the second transistor, a remainder of the stressor layer adjacent gate electrode sidewalls determining a physical boundary of silicide contact to current electrodes of the first transistor and the second transistor. The first transistor and the second transistor may be doped to each be an N-channel transistor. There may be doping the first transistor to be a P-channel transistor and doping the second transistor to be an N-channel transistor. The relaxing stress in the stressor layer that overlies the first transistor may comprise implanting ions into the stressor layer. The forming silicide contact to electrodes of the first transistor and the second transistor further may comprise forming silicided regions to each of a source, a drain and a gate electrode of the first transistor and the second transistor while using the remainder of the stressor layer adjacent to the gate electrode of the first transistor and the second transistor for determining a physical boundary of the source and the drain of the first transistor and the second transistor.

Further a method includes forming a first MOS transistor and a second MOS transistor in which each has a first sidewall spacer adjacent a gate, removing the first sidewall spacer adjacent the gate of both the first MOS transistor and the second MOS transistor, depositing a stressor layer overlying the first MOS transistor and the second MOS transistor, modifying a first portion of the stressor layer that is overlying the second MOS transistor while not substantially modifying a stress characteristic of a second portion of the stressor layer that is overlying the first MOS transistor, transferring stress of the second portion of the stressor layer to a channel of the first MOS transistor by annealing, removing portions of the first and second portions of the stressor layer to form a second sidewall spacer adjacent the gate of both the first MOS transistor and the second MOS transistor, and forming electrical contacts to current electrodes and the gates of the first MOS transistor and the second MOS transistor, the second sidewall spacers ensuring an offset of the electrical contacts from a channel of the first MOS transistor and the second MOS transistor. The stressor layer may comprise a nitride film that is tensile. The modifying the first portion of the stressor layer may comprise implanting ions in the stressor layer. There may be implanting the first portion of the stressor layer with either xenon or germanium ions. The second sidewall spacer May be a nitride spacer and removing the second sidewall spacer adjacent the gate of both the first MOS transistor and the second MOS transistor may comprise etching the nitride spacer with a hot phosphoric acid. The first MOS transistor may be an N-channel transistor, and the second MOS transistor may be a P-channel transistor.

What is claimed is:
1. A method comprising:
providing a substrate;
forming a P-channel transistor and an N-channel transistor using the substrate, each of the P-channel transistor and the N-channel transistor comprising a source, a drain and a gate having a first sidewall spacer;
removing the first sidewall spacer of the P-channel transistor and the N-channel transistor;
forming a stressor layer having a stress characteristic and overlying the P-channel transistor and the N-channel transistor;
modifying the stress characteristic of the stressor layer overlying the P-channel transistor to form a modified stress characteristic differing from a portion overlying the N-channel transistor;

transferring the stress characteristic of an overlying portion of the stressor layer to a channel of each of the N-channel transistor and the P-channel transistor by annealing;

forming a second sidewall spacer adjacent the gate of each of the P-channel transistor and the N-channel transistor from the stressor layer; and forming silicided electrical contacts to each of the source, the drain and the gate of the P-channel transistor and the N-channel transistor while using the second sidewall spacer adjacent the gate of each of the P-channel transistor and the N-channel transistor for determining a physical boundary of the silicided electrical contacts to the source and drain of the P-channel transistor and N-channel transistor.

2. The method of claim 1 wherein forming the second sidewall spacer adjacent each of the P-channel transistor and the N-channel transistor further comprises removing portions of the stressor layer wherein remainder portions of the stressor layer comprise the second sidewall spacer adjacent the gate of each of the P-channel transistor and the N-channel transistor.

3. The method of claim 2 further comprising providing an etch stop layer overlying the source and the drain of each of the P-channel transistor and the N-channel transistor when removing the stressor layer.

4. The method of claim 1 wherein modifying the stress characteristic from the stressor layer overlying the P-channel transistor further comprises implanting the stressor layer.

5. The method of claim 4 further comprising ion implanting the stressor layer overlying only the P-channel transistor with either xenon or germanium ions.

6. The method of claim 1 wherein the substrate is a semiconductor substrate, the method further comprising providing the substrate overlying an insulator to form a silicon-on-insulator (SOI) semiconductor device.

7. The method of claim 1 wherein the stress characteristic is tensile and forming the stressor layer further comprises forming a nitride film.

8. The method of claim 1 further comprising:
forming the first sidewall spacer to have a different size than the second sidewall spacer.

9. A method comprising:
forming a first transistor adjacent a second transistor;
removing sidewall spacers from around gate electrodes of the first transistor and the second transistor;
forming a stressor layer overlying the first transistor and the second transistor;
relaxing stress in the stressor layer that overlies the first transistor while not substantially modifying stress in the stressor layer that overlies the second transistor;
transferring stress of the stressor layer to a channel of each of the first transistor and the second transistor by annealing;
removing the stressor layer except adjacent gate electrode sidewalls of the first transistor and the second transistor; and
forming silicide contact to electrodes of the first transistor and the second transistor, a remainder of the stressor layer adjacent gate electrode sidewalls determining a physical boundary of silicide contact to current electrodes of the first transistor and the second transistor.

10. The method of claim 9 further comprising:
doping the first transistor and the second transistor to each be an N-channel transistor.

11. The method of claim 9 further comprising:
doping the first transistor to be a P-channel transistor and doping the second transistor to be an N-channel transistor.

12. The method of claim 9 wherein relaxing stress in the stressor layer that overlies the first transistor further comprises implanting ions into the stressor layer.

13. The method of claim 9 wherein the forming silicide contact to electrodes of the first transistor and the second transistor further comprises forming silicided regions to each of a source, a drain and a gate electrode of the first transistor and the second transistor while using the remainder of the stressor layer adjacent to the gate electrode of the first transistor and the second transistor for determining a physical boundary of the source and the drain of the first transistor and the second transistor.

14. A method comprising:
forming a first MOS transistor and a second MOS transistor, each having a first sidewall spacer adjacent a gate;
removing the first sidewall spacer adjacent the gate of both the first MOS transistor and the second MOS transistor;
depositing a stressor layer overlying the first MOS transistor and the second MOS transistor;
modifying a first portion of the stressor layer that is overlying the second MOS transistor while not substantially modifying a stress characteristic of a second portion of the stressor layer that is overlying the first MOS transistor;
transferring stress of the second portion of the stressor layer to a channel of the first MOS transistor by annealing;
removing portions of the first and second portions of the stressor layer to form a second sidewall spacer adjacent the gate of both the first MOS transistor and the second MOS transistor; and
forming electrical contacts to current electrodes and the gates of the first MOS transistor and the second MOS transistor, the second sidewall spacers ensuring an offset of the electrical contacts from a channel of the first MOS transistor and the second MOS transistor.

15. The method of claim 14 wherein the stressor layer further comprises a nitride film that is tensile.

16. The method of claim 14 wherein modifying the first portion of the stressor layer further comprises implanting ions in the stressor layer.

17. The method of claim 16 further comprising implanting the first portion of the stressor layer with either xenon or germanium ions.

18. The method of claim 16 wherein the second sidewall spacer is a nitride spacer and removing the second sidewall spacer adjacent the gate of both the first MOS transistor and the second MOS transistor further comprises etching the nitride spacer with a hot phosphoric acid.

19. The method of claim 16 wherein the first MOS transistor is an N-channel transistor and the second MOS transistor is a P-channel transistor.

* * * * *